United States Patent
Mok et al.

(10) Patent No.: US 9,009,939 B2
(45) Date of Patent: Apr. 21, 2015

(54) METHOD AND SYSTEM FOR MOVING WAFER DURING SCANNING THE WAFER

(75) Inventors: Peter Mok, Fremont, CA (US);
Ko-Chuan Jen, San Jose, CA (US);
Zhimin Wan, Sunnyvale, CA (US)

(73) Assignee: Advanced Ion Beam Technology, Inc (TW), Hsinchu (TW)

( * ) Notice: Subject to any disclaimer, the term of this patent is extended or adjusted under 35 U.S.C. 154(b) by 998 days.

(21) Appl. No.: 12/479,288

(22) Filed: Jun. 5, 2009

(65) Prior Publication Data

US 2010/0310341 A1 Dec. 9, 2010

(51) Int. Cl.
| | |
|---|---|
| *B25B 27/14* | (2006.01) |
| *H01J 37/08* | (2006.01) |
| *H01L 21/687* | (2006.01) |
| *H01J 37/20* | (2006.01) |
| *H01J 37/317* | (2006.01) |
| *H01L 21/67* | (2006.01) |

(52) U.S. Cl.
CPC ........ *H01L 21/68764* (2013.01); *H01J 37/20* (2013.01); *H01J 37/3171* (2013.01); *H01J 2237/20207* (2013.01); *H01J 2237/20228* (2013.01); *H01J 2237/204* (2013.01); *H01L 21/67213* (2013.01)

(58) Field of Classification Search
USPC .......... 29/281.1, 281.2, 281.3, 281.4; 269/37; 451/41, 28, 285–288; 250/492.21, 250/492.23, 440.11, 441.11, 442.11, 309, 250/491.1; 414/222.01, 806
See application file for complete search history.

(56) References Cited

U.S. PATENT DOCUMENTS

| | | | | |
|---|---|---|---|---|
| 4,831,270 | A * | 5/1989 | Weisenberger | 250/492.2 |
| 5,641,969 | A * | 6/1997 | Cooke et al. | 250/492.21 |
| 2002/0109106 | A1 * | 8/2002 | Berrian et al. | 250/492.21 |
| 2003/0080300 | A1 * | 5/2003 | Weed et al. | 250/443.1 |
| 2003/0197133 | A1 * | 10/2003 | Turner et al. | 250/492.21 |
| 2008/0073577 | A1 * | 3/2008 | Relleen et al. | 250/492.21 |

* cited by examiner

*Primary Examiner* — Lee D Wilson
*Assistant Examiner* — Nirvana Deonauth
(74) *Attorney, Agent, or Firm* — Morrison & Foerster LLP (57) ABSTRACT

A system and a method for moving a wafer during scanning the wafer by an ion beam. The proposed system includes an extendable/retractable arm, a holding apparatus and a driving apparatus. At least a length of the extendable/retractable arm is adjustable. The holding apparatus is capable of holding a wafer and is fixed on a specific portion of the extendable/retractable arm. Furthermore, the driving apparatus is capable of extending and/or retracting the extendable/retractable arm, such that the holding apparatus is moved together with the specific portion. In addition, the proposed method includes the following steps. First, hold the wafer by a holding apparatus fixed on a specific portion of an extendable/retractable arm. After that, adjust a length of the extendable/retractable arm. Therefore, the holding apparatus, i.e. the wafer, can be moved by the extension/retraction of the extendable/retractable arm.

19 Claims, 12 Drawing Sheets

METHOD AND SYSTEM FOR MOVING WAFER DURING SCANNING THE WAFER

FIELD OF THE INVENTION

The present invention generally relates to a system and a method for moving a wafer during scanning the wafer, and more particularly to a system and a method for moving a wafer during scanning the wafer with simple mechanism.

DESCRIPTION OF THE RELATED ART

Figure 1:
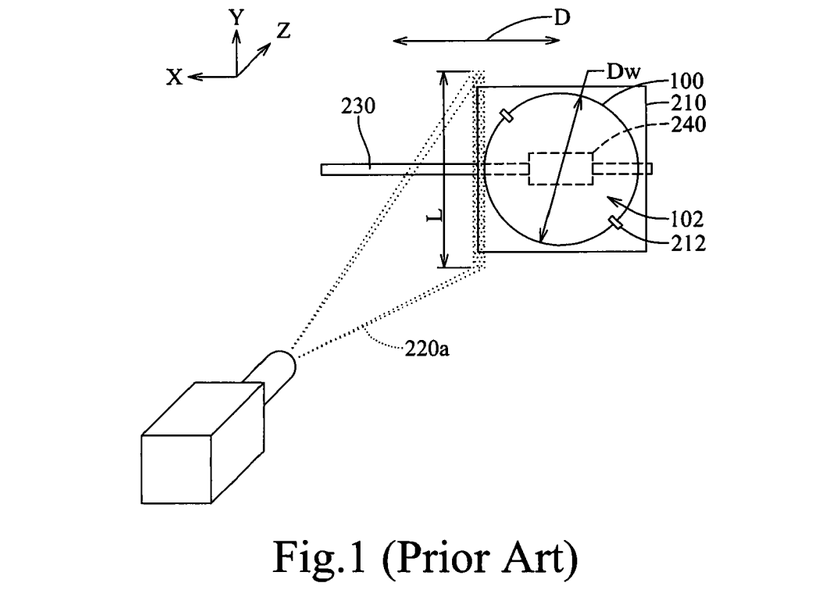
FIG. 1 illustrates a schematic view of a well-known system for implanting a wafer.
Figure 2A:
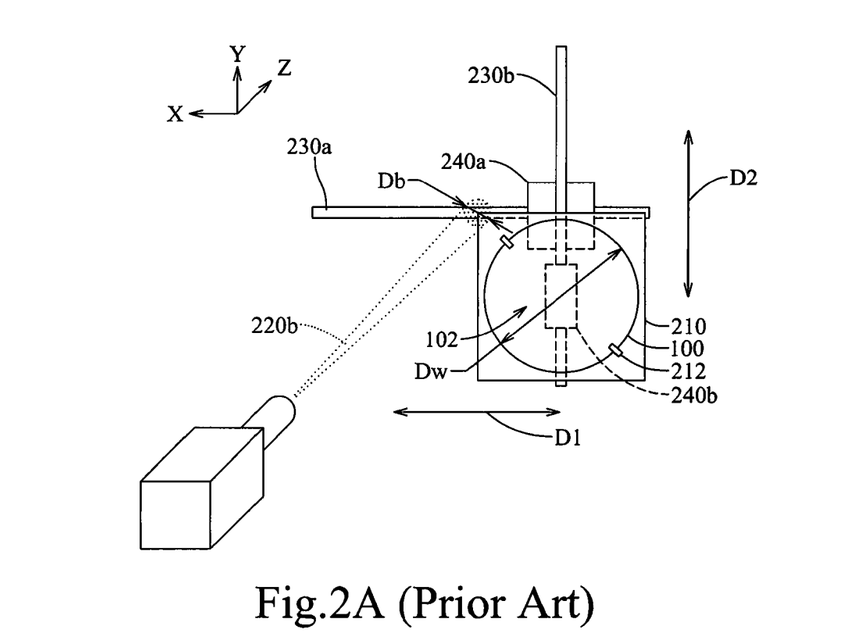
FIG. 2A illustrates a schematic view of another well-known system for implanting a wafer.
Figure 2B:
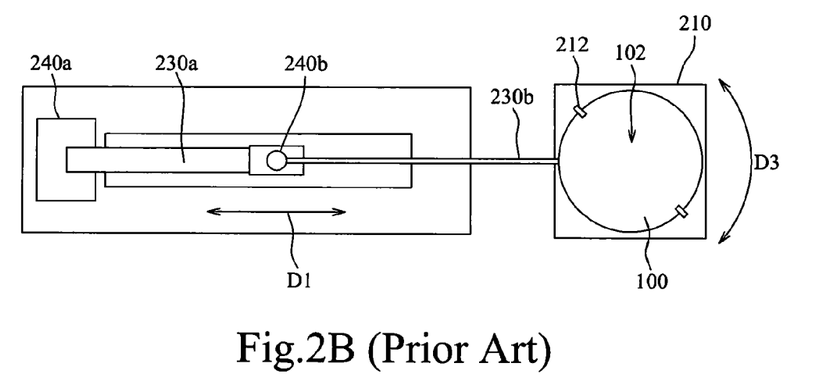
FIG. 2B illustrates a schematic view of another well-known system for implanting a wafer.

FIGS. 1, 2A and 2B respectively illustrate a schematic view of a system for implanting a wafer. To uniformly implant a wafer, two main approaches illustrated in FIGS. 1, 2A and 2B in the prior art are usually used. Referring to FIG. 1 first, one of the approaches includes holding the wafer 100 on a plate 210 by a holder 212 and continuously projecting an ion beam 220a with a bar cross-section into the wafer 100, wherein the transmission path of the ion beam 220a is parallel to a Z direction, and a length L of the bar cross-section parallel to a Y direction is larger than a diameter Dw of the wafer 100. Next, the wafer 100 and the plate 210 are moved with a driving apparatus 240 back and forth along an arm 230 parallel to an X direction and perpendicular to the Y and Z directions. Herein, the moving distance D of the wafer 100 is equal to or larger than the diameter Dw of the wafer 100, so that the ion beam 220a may scan the whole surface 102 of the wafer 100 during a one-dimensional scanning process (the direction of the moving distance D).

Now, referring to FIG. 2A, the second approach includes holding the wafer 100 on the plate 210 by the holder 212 and then continuously projecting an ion beam 220b with a spot cross-section into the wafer 100, wherein the diameter Db of the ion beam 220b is smaller than the diameter Dw of the wafer 100. Next, the wafer 100, the plate 210, a second arm 230b and a second driving apparatus 240b are moved with a first driving apparatus 240a back and forth along a first arm 230a parallel to the X direction. And, the wafer 100 and the plate 210 are moved back and forth with a second driving apparatus 240b along the second arm 230b parallel to the Y direction. Herein, traveling distances D1 and D2 of the wafer 100 are equal to or larger than the diameter Dw of the wafer 100, so that the ion beam 220b may scan the whole surface 102 of the wafer 100 during a two-dimensional scanning process (the direction of the traveling distance D1 and the direction of the traveling distance D2).

In another example of second approach, referring to FIG. 2B, the wafer 100, the plate 210 and the second arm 230b may also be swung back and forth along a traveling direction D3 by the second driving apparatus 240b. Therefore, the ion beam 220b as illustrated in FIG. 2A may also scan the whole surface 102 of the wafer 100 during a two-dimensional scanning process (the direction of the traveling distance D1 and the traveling direction D3).

Note that in the prior art, the plate 210 illustrated in FIG. 1 is held by the driving apparatus 240. Also, the plate 210, the second arm 230b and the first driving apparatus 240a illustrated in FIG. 2A are all held by the second driving apparatus 240b. Similarly, the plate 210, the second arm 230b and the second driving apparatus 240b are all held by the first arm 230a which is driven by the first driving apparatus 240a. Therefore, each of the driving apparatus 240, the first driving apparatus 240a and the second driving apparatus 240b must carry a heavy load to move along the arm 230, the first arm 230a and the first arm 230a, which would consume a lot of power, with a more complicated mechanism, and a higher cost. For example, each can have a small built-in motor to provide the power for driving the gear wheel couples with the arm 230/230a, such that it can move back and forth along the arm 230/230a. Besides, along with the development of the technology, the diameter Dw of the wafer 100 is continuously increased so that the distance to move, such as D and D1, is correspondingly continuously increased. Clearly, the disadvantage(s) is significantly increased, too.

SUMMARY OF THE INVENTION

The present invention is directed to a system and a method for moving a wafer during scanning the wafer, which may consume less power with simpler mechanism and lower cost.

One embodiment provides a system for moving a wafer during scanning the wafer. The system comprises an extendable/retractable arm, a holding apparatus and a driving apparatus. At least a length of the extendable/retractable arm is adjustable. The holding apparatus is capable of holding a wafer and is fixed on a specific portion of the extendable/retractable arm. Furthermore, the driving apparatus is capable of extending and/or retracting the extendable/retractable arm, such that the holding apparatus is moved together with the specific portion of the extended/retracted arm. In other words, there is no relative motion between the holding apparatus and the extendable/retractable arm.

Another embodiment provides a method for moving a wafer during scanning the wafer. First, hold the wafer by a holding apparatus fixed on a specific portion of an extendable/retractable arm. After that, adjust a length of the extendable/retractable arm. Therefore, the holding apparatus will be moved together with the specific portion of the extended/retracted arm. In other words, there is no relative motion between the holding apparatus and the specific portion of the extendable/retractable arm.

In the present invention, the device for extending/retracting the extendable/retractable arm could be located on or proximate to a terminal of the extendable/retractable arm, so as to reduce the total load moved along the extendable/retractable arm (or, moved with the extension/retraction of the extendable/retractable arm). Therefore, the system and the method of the invention may consume less power with a simpler mechanism and lower cost.

DETAILED DESCRIPTION OF THE INVENTION

Reference will now be made in detail to specific embodiments of the present invention. Examples of these embodiments are illustrated in the accompanying drawings. While the invention will be described in conjunction with these specific embodiments, it will be understood that it is not intended to limit the invention to these embodiments. In fact, it is intended to cover alternatives, modifications, and equivalents as may be included within the spirit and scope of the invention as defined by the appended claims. In the following description, numerous specific details are set forth in order to provide a through understanding of the present invention. The present invention may be practiced without some or all of these specific details. In other instances, well-known process operations are not described in detail in order not to obscure the present invention.

Figure 3:
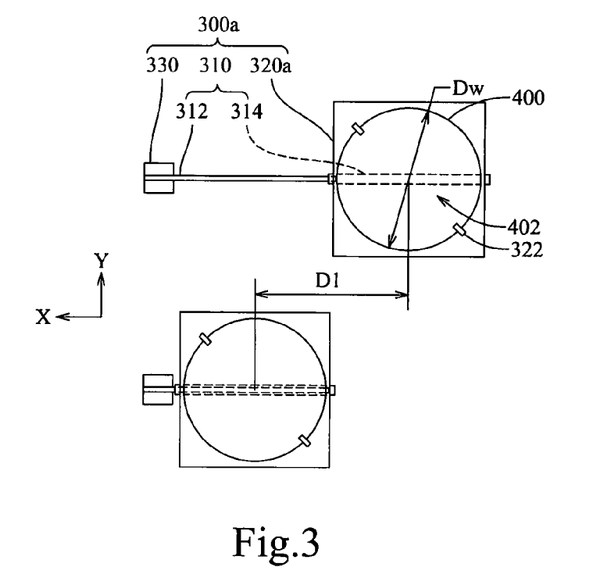
FIG. 3 illustrates a schematic view of a system for moving a wafer during scanning the wafer according to an embodiment of the present invention.
Figure 4:
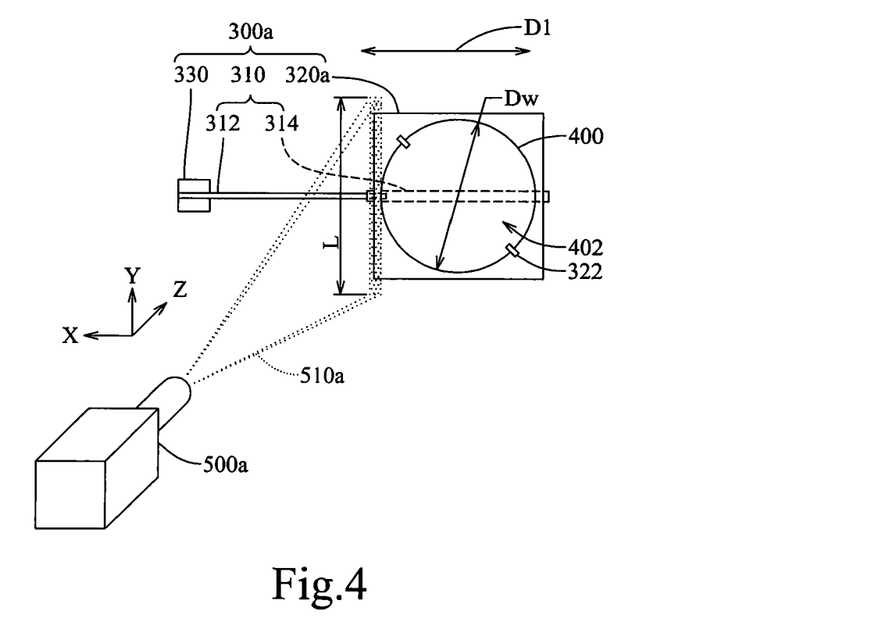
FIG. 4 illustrates a schematic view of the system illustrated in FIG. 3 assembled to an ion beam assembly.
Figure 5:
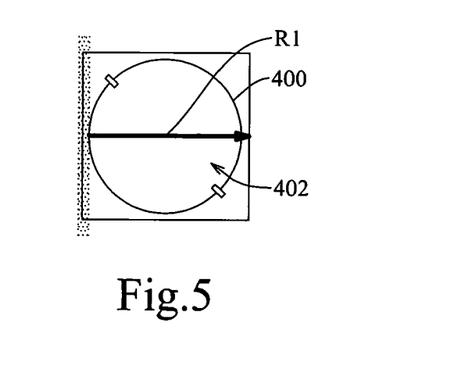
FIG. 5 illustrates a schematic view of a scan route that the ion beam illustrated in FIG. 4 scans a surface of the wafer held by the system illustrated in FIG. 3.

FIG. 3 illustrates a schematic view of a system for moving a wafer during scanning the wafer according to an embodiment of the present invention, and FIG. 4 illustrates a schematic view of the system illustrated in FIG. 3 assembled to an ion beam assembly. FIG. 5 illustrates a schematic view of a scan route that the ion beam illustrated in FIG. 4 scans a surface of the wafer held by the system illustrated in FIG. 3. Referring to FIG. 3 first, a system 300a for moving a wafer 400 during scanning the wafer comprises an extendable/retractable arm 310, a holding apparatus 320a and a driving apparatus 330. At least a length of the extendable/retractable arm 310 is adjustable. The holding apparatus 320a is capable of holding the wafer 400 and is fixed on a specific portion of the extendable/retractable arm 310. Furthermore, the driving apparatus 330 is capable of extending and/or retracting the extendable/retractable arm 310, such that the holding apparatus 320a is moved with the specific portion when the extendable/retractable arm 310 is extended or retracted.

In detail, referring to FIGS. 3 and 4, the system 300a in the present embodiment may be assembled within a chamber (not shown) of an ion implanter, wherein an ion beam assembly 500a of the ion implanter may provide an ion beam 510a with a bar cross-section. A transmission path of the ion beam 510a is parallel to a Z direction, and a length L of the bar cross-section parallel to a Y direction is larger than or equal to a diameter Dw of the wafer 400. In addition, the holding apparatus 320a holds the wafer 400 with a chuck 322, and a surface 402 of the wafer 400 to be implanted faces the ion beam 510a.

Furthermore, the extendable/retractable arm 310 is parallel to an X direction and includes a first arm 312 and a second arm 314 glidingly connected to one another. The length of the first arm 312 can be increased (extendable) or decreased (retractable). A fixed end of the first arm 312 is fixed on a wall (not shown) of the chamber, and the driving apparatus 330 is located thereon or close to here. Another end of first arm 312 which connects to the second arm 314 is free, and the holding apparatus 320a is fixed on a specific portion of the second arm 314. In addition, a first traveling distance D1 of the second arm 314 relative to the fixed end of the first arm 312 is substantially equal to the diameter Dw of the wafer 400. Therefore, when the driving apparatus 330 drives the second arm 314 to move along the free end of the first arm 312 back and forth, the extendable/retractable arm 310 is extended or retracted, and the second arm 314 brings the holding apparatus 320a and the wafer 400 to move parallel to the X direction, so that the ion beam 510a may scan the whole surface 402 along a scan route RI illustrated in FIG. 5.

Note that in the present embodiment, the driving apparatus 330 is located to or closed to an end of the extendable/retractable arm 310 and will not be moved along the first arm 312 when the length of the extendable/retractable arm 310 is adjusted. Therefore, compared to the prior art illustrated in FIG. 1, the total load moved along the extendable/retractable arm 310 is lighter, so that the system 300a may consume less power, simple mechanism and low cost.

Furthermore, the extendable/retractable arm 310 illustrated herein is for example only and not for limiting the structure thereof. In a word, the extendable/retractable arm 310 illustrated herein may be extended/retracted as an extendable antenna or a periscope. However, it is easy to achieve adjusting the length of the extendable/retractable arm based on any well-known or to-be-invented technology. For example, m other un-illustrated embodiments, the extendable/retractable arm may have an arm with a specific length and a driving apparatus assembled to the chamber of the ion implanter. The arm passes through a wall of the chamber, and the driving apparatus, for example a gear wheel, a turntable or a cylinder, may drive the arm to move relative to the wall, so as to drive the wafer and the holding apparatus fixed on the arm to approach/leave the wall. Accordingly, equivalent to the extendable/retractable arm 310 illustrated in the above-mentioned embodiment, the length of the arm located within the chamber may also be adjusted.

Figure 6:
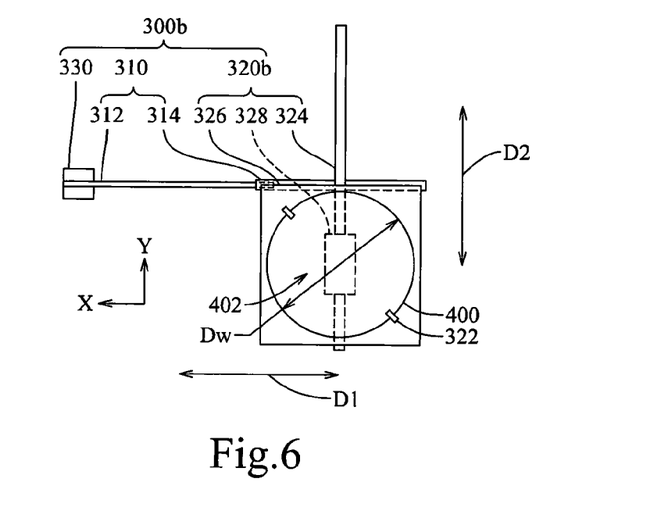
FIG. 6 illustrates a schematic view of a system for moving a wafer during scanning the wafer according to another embodiment of the present invention.
Figure 7:
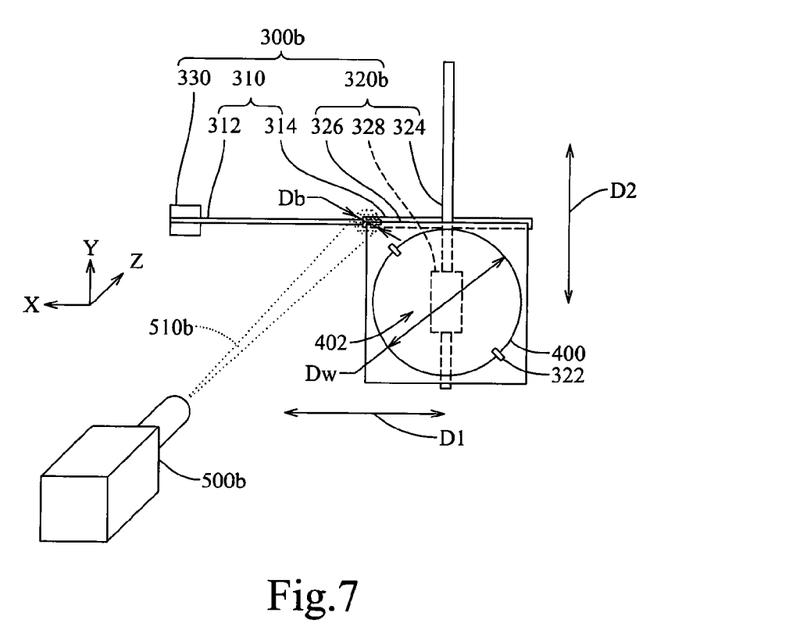
FIG. 7 illustrates a schematic view of the system illustrated in FIG. 6 assembled to an ion beam assembly.
Figure 8:
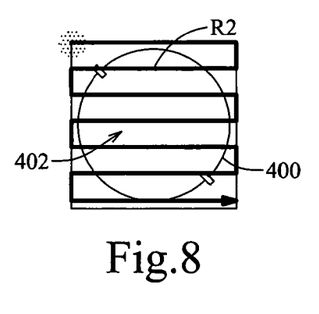
FIG. 8 illustrates a schematic view of a scan route that the ion beam illustrated in FIG. 7 scans a surface of the wafer held by the system illustrated in FIG. 6.
Figure 21:
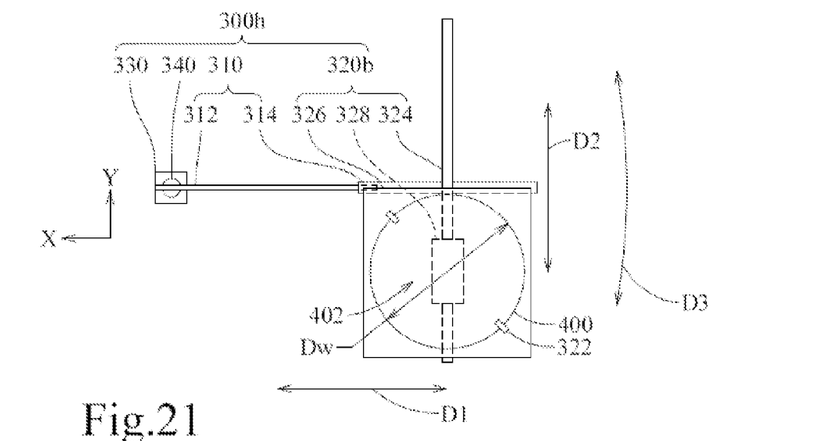
FIG. 21 illustrates a schematic view of a system for moving a wafer during scanning the wafer according to another embodiment of the present invention.

FIG. 6 illustrates a schematic view of a system for moving a wafer during scanning the wafer according to another embodiment of the present invention, and FIG. 7 illustrates a schematic view of the system illustrated in FIG. 6 assembled to an ion beam assembly. FIG. 8 illustrates a schematic view of a scan route that the ion beam illustrated in FIG. 7 scans a surface of the wafer held by the system illustrated in FIG. 6. FIG. 21 illustrates a schematic view of a system for moving a wafer during scanning the wafer according to another embodiment of the present invention. Referring to FIGS. 6 and 7 first, the system 300b and the ion beam assembly 500b are similar to the system 300a and the ion beam assembly 500a illustrated in FIGS. 3 and 4, except for the cross-sections of ion beams 51Oa and 51Ob respectively provided by the ion beam assemblies 500a and 500b and the structures of the holding apparatuses 320a and 320b. Herein, the description of the similarities between the system 300a and the system 300b are omitted herein.

In the present embodiment, the ion beam 510b has a spot cross-section with a diameter Db smaller than the diameter Dw of the wafer 400. In addition, the holding apparatus 320b comprises the chuck 322, an arm 324, a holding apparatus 326 and a driving apparatus 328. The arm 324 is fixed on the second arm 314 and parallel to the Y direction. The holding apparatus 326, similar to the holding apparatus 320a illustrated in FIG. 3, is located on the arm 324, and may hold the wafer 400 by the chuck 322. The driving apparatus 328 is connected between the arm 324 and may drive the holding apparatus 326 to move back and forth along the arm 324. Furthermore, a second traveling distance D2 of the holding apparatus 326 relative to the arm 324 is substantially equal to the diameter Dw of the wafer 400.

In a word, the holding apparatus 326 and the wafer 400 in the present embodiment may be moved along a direction parallel to the X direction with the driving apparatus 330 that drives both the holding apparatus 326 and the wafer 400, and moved along a direction parallel to the Y direction with the driving apparatus 328 that drives the holding apparatus 326 and the wafer 400, too. Therefore, the ion beam 510b may scan the whole surface 402 along a scan route R2 illustrated in FIG. 8. Similarly, when the length of the extendable/retractable arm 310 is adjusted, the driving apparatus 330 still is fixed in the original position and will not be moved along the first arm 312. Therefore, compared to the prior art illustrated in FIG. 2, the total load moved along the extendable/retractable arm 310 is lighter, so that the system 300b may consume less power, low cost and simple mechanism. Moreover, as illustrated in FIG. 21, a system 300h similar to the system 300b as illustrated in FIG. 6 may further comprise a swing driving apparatus 340, wherein the end of the extendable/retractable arm 310 distant from the second arm 314 may be pivoted to the driving apparatus 330 via the swing driving apparatus 340. Therefore, the swing driving apparatus 340 may swing the holding apparatus 320b and the wafer 400 via the extendable/retractable arm 310 along a traveling direction D3 substantially perpendicular to both of the Z direction and the axis of the extendable/retractable arm 310, and a rotation radius of the wafer 400 relative to the swing driving apparatus 340 is adjustable by adjusting the length of the extendable/retractable arm 310.

Figure 9:
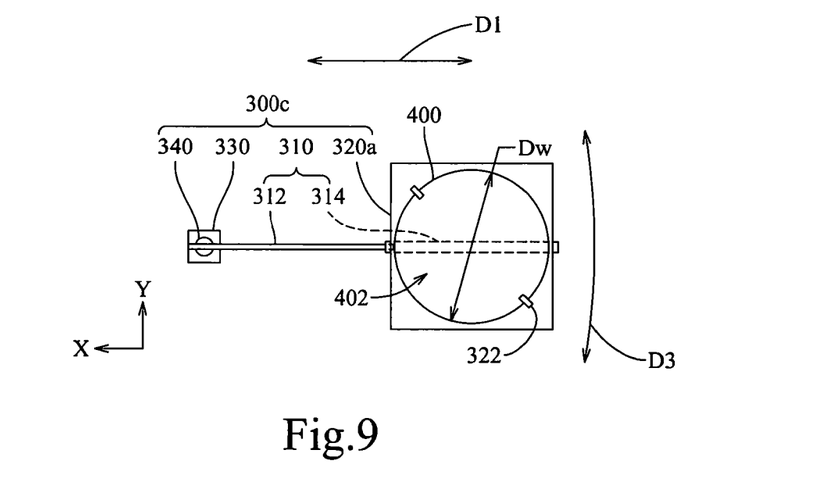
FIG. 9 illustrates a schematic view of a system for moving a wafer during scanning the wafer according to another embodiment of the present invention.
Figure 10:
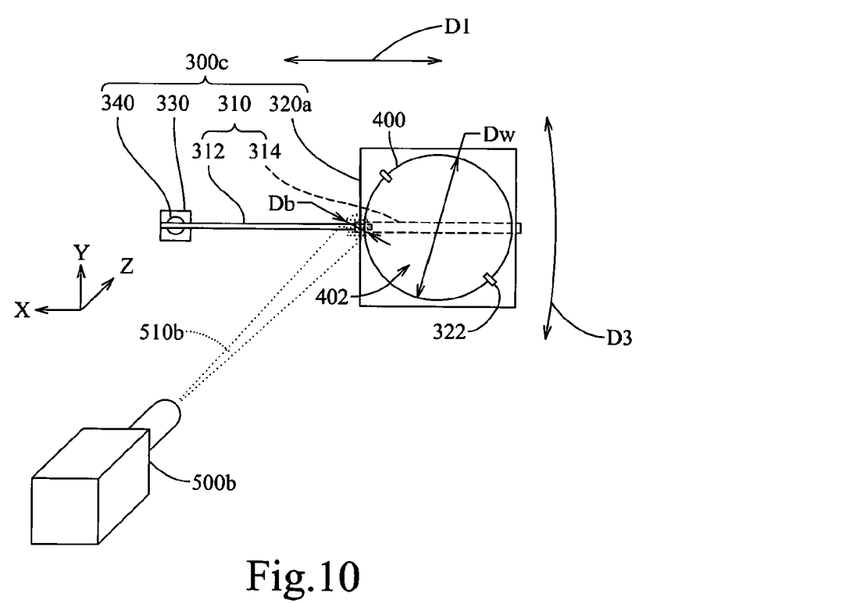
FIG. 10 illustrates a schematic view of the system illustrated in FIG. 9 assembled to the ion beam assembly illustrated in FIG. 7.
Figure 11:
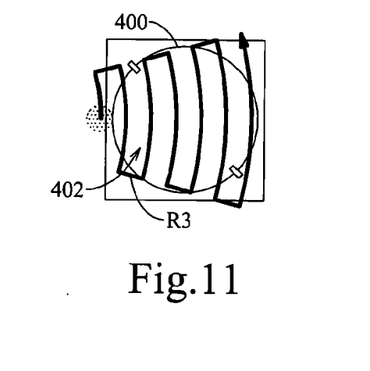
FIG. 11 illustrates a schematic view of a scan route that the ion beam illustrated in FIG. 10 scans a surface of the wafer held by the system illustrated in FIG. 9.
Figure 22:
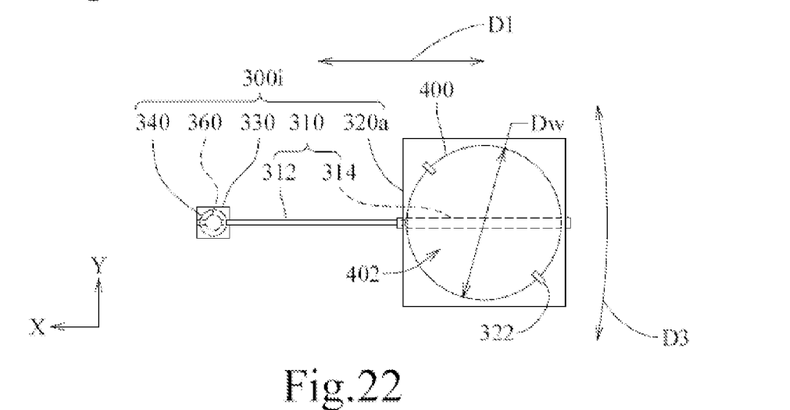
FIG. 22 illustrates a schematic view of a system for moving a wafer during scanning the wafer according to another embodiment of the present invention.

FIG. 9 illustrates a schematic view of a system for moving a wafer during scanning the wafer according to another embodiment of the present invention, and FIG. 10 illustrates a schematic view of the system illustrated in FIG. 9 assembled to the ion beam assembly illustrated in FIG. 7. FIG. 11 illustrates a schematic view of a scan route that the ion beam illustrated in FIG. 10 scans a surface of the wafer held by the system illustrated in FIG. 9. FIG. 22 illustrates a schematic view of a system for moving a wafer during scanning the wafer according to another embodiment of the present invention. Referring to FIGS. 9 and 10 first, the system 300c are similar to the system 300a illustrated in FIGS. 3 and 4, and the ion beam assembly 500b herein is the same as that illustrated in FIG. 7. The difference there-between is the structures of the holding apparatuses 320b and 320c. Again, the similarities between the system 300a and the system 300c are omitted herein.

In the present embodiment, the system 300c may further comprise a swing driving apparatus 340, wherein the end of the extendable/retractable arm 310 distant from the second arm 314 may be pivoted to the wall of the chamber (not shown) of the ion beam assembly 500b via the swing driving apparatus 340. Therefore, the swing driving apparatus 340 may swing the holding apparatus 320a and the wafer 400 via the extendable/retractable arm 310 along a traveling direction D3 substantially perpendicular to both of the Z direction and the axis of the extendable/retractable arm 310, and a rotation radius of the wafer 400 relative to the swing driving apparatus 340 is adjustable by adjusting the length of the extendable/retractable arm 310.

In a word, in the present embodiment, the holding apparatus 320a and the wafer 400 may be driven by the driving apparatus 330 and be moved with the driving apparatus 330 along a direction parallel to the X direction, and swung along the traveling direction D3 by the swing driving apparatus 340. Therefore, the ion beam 510b may scan the whole surface 402 along a scan route R3 illustrated in FIG. 11. Compared to the embodiment illustrated in FIGS. 6, 7, and 8, when the length of the extendable/retractable arm 310 in the present embodiment is adjusted, the arm 324 and the driving apparatus 328 will not accompany the holding apparatus 320a and the wafer 400 to move at the same time. Indeed, the function of the arm 324 and the driving apparatus 328 is essentially replaced by the swing driving apparatus 340. Herein, although the direction of second traveling distance D2 is slightly different than the traveling direction D3, by comparing FIG. 8 with FIG. 11, it is clear that both are useful for two-dimensional scanning over the wafer 400. Therefore, the total load carried by the extendable/retractable arm 310 is much lighter, so that the system 300c may further consume less power, lower cost and simpler mechanism. Moreover, as illustrated in FIG. 22, a system 300i similar to the system 300c as illustrated in FIG. 9 may further comprise a wafer position apparatus 360, wherein the wafer position apparatus 360 may be located within the swing driving apparatus 340, and may put the extendable/retractable arm 310, the holding apparatus 320a and the wafer 400 on a position as illustrated in FIG. 22, so as to enable the extendable/retractable arm 310 to be parallel to the X direction and align the axis of the ion beam on a desire location, for example a center, of the surface 402.

Figure 12:
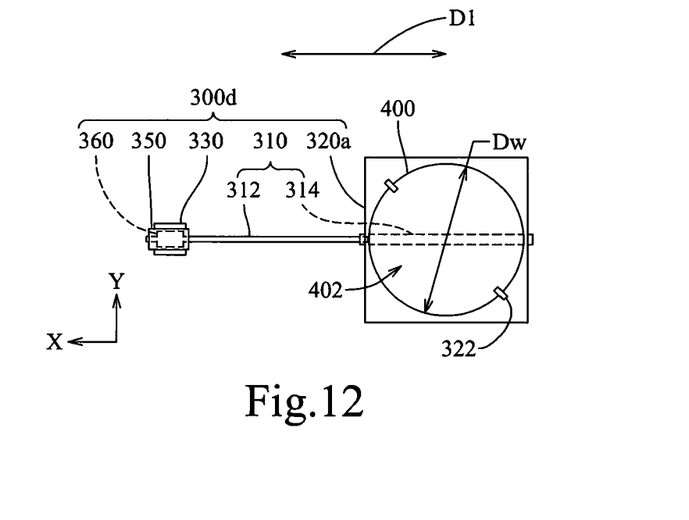
FIG. 12 illustrates a schematic view of a system for moving a wafer during scanning the wafer according to another embodiment of the present invention.
Figure 13:
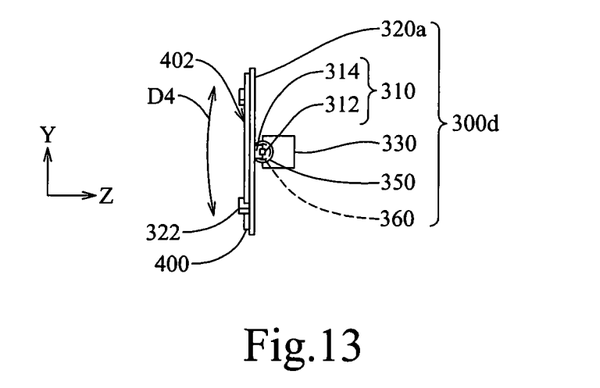
FIG. 13 illustrates a side view of the system illustrated in FIG. 12.

FIG. 12 illustrates a schematic view of a system for moving a wafer during scanning the wafer according to another embodiment of the present invention, and FIG. 13 illustrates a side view of the system illustrated in FIG. 12. Referring to FIGS. 12 and 13, the system 300d are similar to the system 300a illustrated in FIGS. 3 and 4, except for the system further comprises a tilting driving apparatus 350 and a wafer position apparatus 360. Again, the description of the similarities between the system 300a and the system 300d are omitted.

In the present embodiment, the extendable/retractable arm 310 may be pivoted to the driving apparatus 330 via the tilting driving apparatus 350, and the wafer position apparatus 360 may be located within the driving apparatus 350. The tilting driving apparatus 350 may rotate the extendable/retractable arm 310 around the axis of the extendable/retractable arm 310 to tilt the holding apparatus 320a and the wafer 400 along a tilting direction D4, so that an ion beam (not shown) transmitting parallel to the Z direction may be non-perpendicularly incident to the surface 402 of the wafer 400. In addition, the wafer position apparatus 360 may put the holding apparatus 320a and the wafer 400 on a horizontal loading position thereof illustrated in FIG. 13, so that the ion beam may be perpendicularly incident to the surface 402 again. Furthermore, the wafer position apparatus 360 may also rotate the wafer 400 to an appropriate angle, so that the wafer may be caught by a robot arm (not shown) of the ion implanter much easily.

Figure 14:
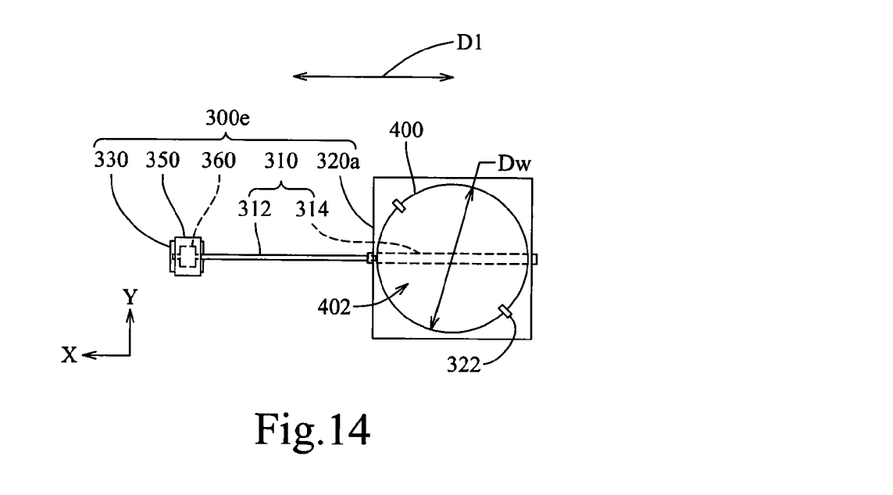
FIG. 14 illustrates a schematic view of a system for moving a wafer during scanning the wafer according to another embodiment of the present invention.
Figure 15:
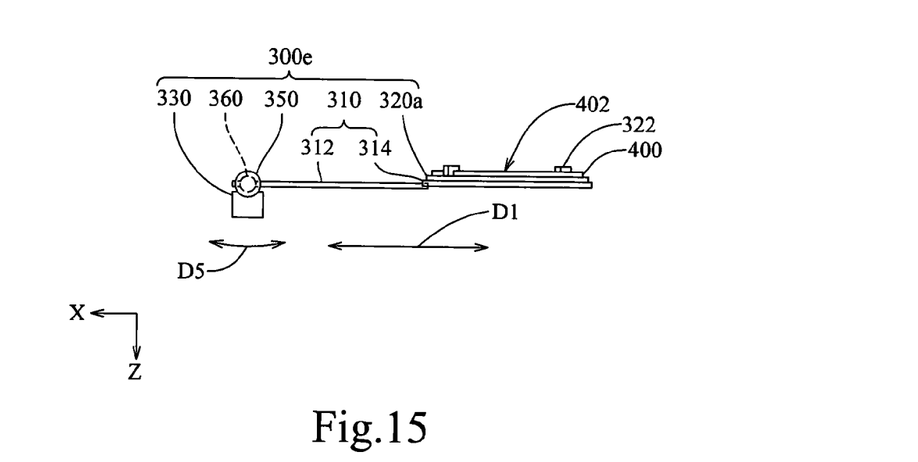
FIG. 15 illustrates a bottom view of the system illustrated in FIG. 14.
Figure 23:
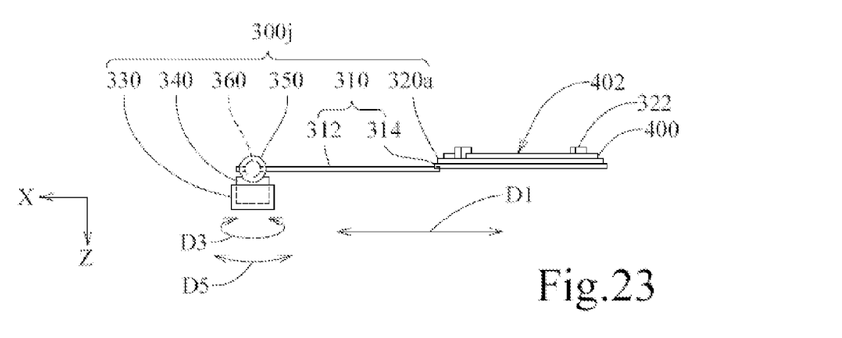
FIG. 23 illustrates a schematic view of a system for moving a wafer during scanning the wafer according to another embodiment of the present invention.

FIG. 14 illustrates a schematic view of a system for moving a wafer during scanning the wafer according to another embodiment of the present invention, and FIG. 15 illustrates a bottom view of the system illustrated in FIG. 14. FIG. 23 illustrates a schematic view of a system for moving a wafer during scanning the wafer according to another embodiment of the present invention. Referring to FIGS. 14 and 15, the system 300e are similar to the system 300d illustrated in FIGS. 12 and 13, except for the tilting directions D4 and D5. Again, the description of the similarities between the system 300d and the system 300e are omitted herein.

In the present embodiment, the tilting driving apparatus 350 may rotate the extendable/retractable arm 310 around a tilt axis parallel to the Y direction to tilt the holding apparatus 320a and the wafer 400 along a tilting direction D5, so that an ion beam (not shown) transmitting parallel to the Z direction may be non-perpendicularly incident to the surface 402 of the wafer 400. Similarly, the wafer position apparatus 360 may also put the holding apparatus 320a and the wafer 400 on a horizontal loading position thereof illustrated in FIG. 15, so that the ion beam may be perpendicularly incident to the surface 402 again. Besides, the wafer position apparatus 360 may also rotate the wafer 400 to an appropriate angle, so that the wafer may be caught by a robot arm (not shown) of the ion implanter much correctly. In other un-illustrated embodiments, the tilting driving apparatus may rotate the extendable/retractable arm around any tilt axis different to the axis of the extendable/retractable arm. Moreover, as illustrated in FIG. 23, a system 300j similar to the system 300e as illustrated in FIG. 15 may further comprise a swing driving apparatus 340, wherein the tilting driving apparatus 350 may be pivoted to the driving apparatus 330 via the swing driving apparatus 340. Therefore, the swing driving apparatus 340 may swing the extendable/retractable arm 310, the holding apparatus 320a, the tilting driving apparatus 350, the wafer position apparatus 360 and the wafer 400 along the traveling direction D3 substantially perpendicular to both of the Z direction and the axis of the extendable/retractable arm 310, and a rotation radius of the wafer 400 relative to the swing driving apparatus 340 is adjustable by adjusting the length of the extendable/retractable are 310.

Figure 16:
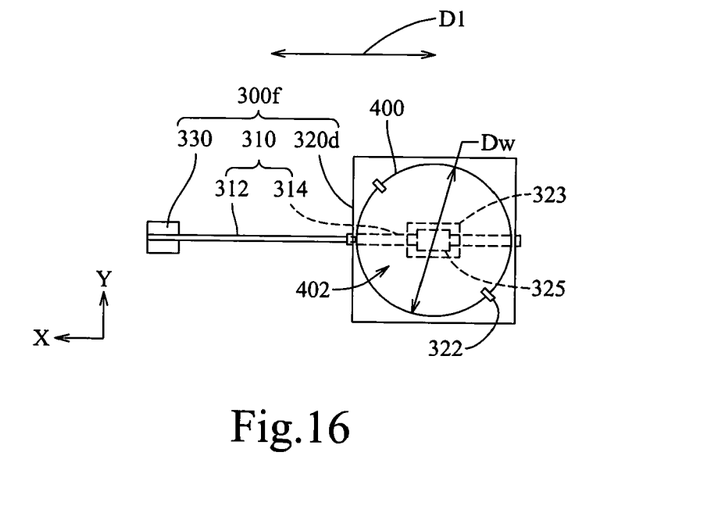
FIG. 16 illustrates a schematic view of a system for moving a wafer during scanning the wafer according to another embodiment of the present invention.
Figure 17:
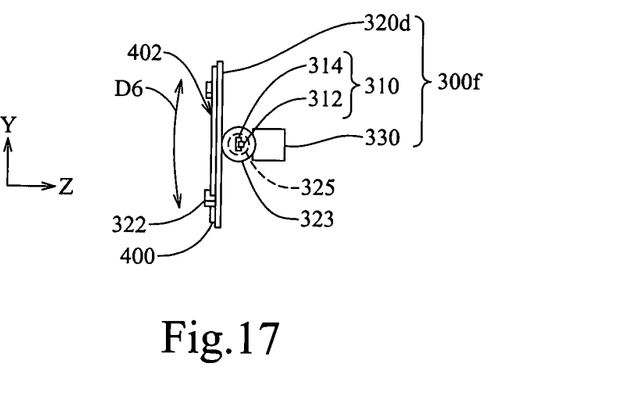
FIG. 17 illustrates a side view of the system illustrated in FIG. 16.

FIG. 16 illustrates a schematic view of a system for moving a wafer during scanning the wafer according to another embodiment of the present invention, and FIG. 17 illustrates a side view of the system illustrated in FIG. 16. Referring to FIGS. 16 and 17, the system 300f are similar to the system 300a illustrated in FIGS. 3 and 4, except for the holding apparatus 320d further comprises a tilting driving apparatus 323 and a wafer position apparatus 325. Again, the description of the similarities between the system 300a and the system 300f are omitted herein.

In the present embodiment, the holding apparatus 320d may be pivoted to the extendable/retractable arm 310 via the tilting driving apparatus 323, and the wafer position apparatus 325 may be located within the tilting driving apparatus 323. The tilting driving apparatus 323 may rotate the holding apparatus 320d around a tilt axis parallel to the X direction to tilt the wafer 400 along a tilting direction D6, so that an ion beam (not shown) transmitting along a direction parallel to the Z direction may be non-perpendicularly incident to the surface 402 of the wafer 400. In addition, the wafer position apparatus 325 may put the holding apparatus 320d and the wafer 400 on a horizontal loading position thereof illustrated in FIG. 17, so that the ion beam may be perpendicularly incident to the surface 402 again.

Figure 18:
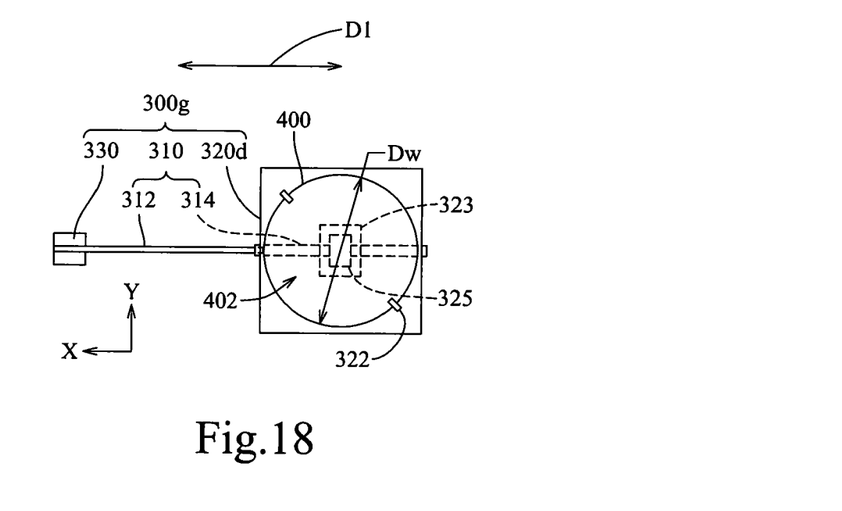
FIG. 18 illustrates a schematic view of a system for moving a wafer during scanning the wafer according to another embodiment of the present invention.
Figure 19:
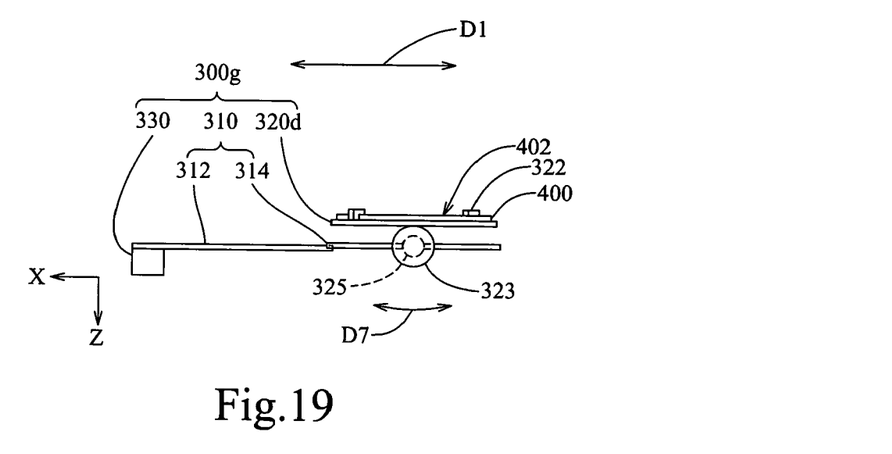
FIG. 19 illustrates a side view of the system illustrated in FIG. 18.

FIG. 18 illustrates a schematic view of a system for moving a wafer during scanning the wafer according to another embodiment of the present invention, and FIG. 19 illustrates a bottom view of the system illustrated in FIG. 18. Referring to FIGS. 18 and 19, the system 300g are similar to the system 300f illustrated in FIGS. 16 and 17, except for the tilting directions D7 and D6. Furthermore, the description of the similarities between the system 300f and the system 300g are omitted herein.

In the present embodiment, the tilting driving apparatus 323 may rotate the holding apparatus 320d around a tilt axis parallel to the Y direction to tilt the wafer 400 along a tilting direction D7, so that an ion beam (not shown) transmitting along a direction parallel to the Z direction may be non-perpendicularly incident to the surface 402 of the wafer 400. Similarly, the wafer position apparatus 325 may also put the holding apparatus 320d and the wafer 400 on a horizontal loading position thereof illustrated in FIG. 19, so that the ion beam may be perpendicularly incident to the surface 402 again. Furthermore, it may also rotate the wafer 400 to an appropriate angle, so that the wafer may be caught by a robot arm (not shown) of the ion implanter much easily. In other un-illustrated embodiments, the tilting driving apparatus may rotate the extendable/retractable arm around any tilt axis different from the axis of the extendable/retractable arm.

According to the above-mentioned embodiments, it is easy to achieve moving a wafer during scanning the wafer based on well-known technology with one of the systems 300a to 300g by following steps.

Figure 20:
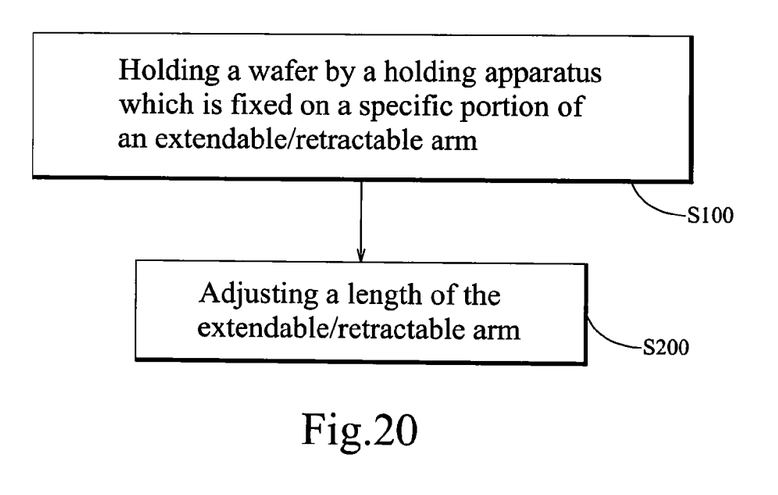
FIG. 20 illustrates a flow chart of a method for moving a wafer during scanning the wafer according to an embodiment of the present invention.

FIG. 20 illustrates a flow chart of a method for moving a wafer during scanning the wafer according to an embodiment of the present invention. Referring to FIGS. 3 and 20, the wafer 400 can be held by the holding apparatus 320a fixed on a specific portion of the extendable/retractable arm 310, and a length of the extendable/retractable arm 310 can be adjusted by the driving apparatus 330 in order to move the holding apparatus 320a.

In the present embodiment, an end of the extendable/retractable arm 310 may be fixed on the wall of the chamber of the ion beam assembly 500a illustrated in FIG. 4 and another end of the extendable/retractable arm 310 may be free. In addition, the wafer 400 may be held by the holding apparatus 320b illustrated in FIG. 6, so as to be moved along a direction parallel to the Y direction by the driving apparatus 328. Alternatively, the wafer 400 may be held by the holding apparatus 320a illustrated in FIG. 9, so as to be moved along the traveling direction D3 substantially perpendicular to the axis of the extendable/retractable arm 310.

Furthermore, the holding apparatus 320a and the wafer 400 may further be tilted along at least one of the tilting directions D4, D5, D6 and D7 by the tilting driving apparatus 350 illustrated in FIGS. 13 and 15 and the tilting driving apparatus 323 illustrated in FIGS. 17 and 19 respectively, so that an ion beam transmitting parallel to the Z direction may be non-perpendicularly incident to the surface 402 of the wafer 400. Thereafter, the holding apparatus 320a and the wafer 400 may be put on a horizontal loading position again by corresponding wafer position apparatus 360 illustrated in FIGS. 13 and 15 or the wafer position apparatus 325 illustrated in FIGS. 17 and 19.

Note that the systems 300a to 300g merely illustrate some of the embodiments for implementing the method illustrated in the invention. A person having ordinary skill in the art may also use other equivalent system un-illustrated herein to achieve the purpose of the present invention, which shall also be construed to be within the scope of the present invention. In a word, the method illustrated in the invention is not to be limited by using the systems 300a to 300g.

In summary, the extendable/retractable arm in the present invention is capable of replacing the arm and the first arm in the prior arts. Herein, the required device for moving the wafer along the direction of both the arm and first arm is replaced by the device for extending/retracting the extendable/retractable arm. Moreover, when the device for moving also moves along the arm and/or the first arm, the device for extending/retracting is located on or proximate to a terminal of the extendable/retractable arm. Therefore, the total load moved along the extendable/retractable arm is reduced. Accordingly, the system and the method of the invention may consume less power with lower cost and simpler mechanism.

In addition, the swing driving apparatus in the present invention is capable of replacing the second arm and the driving apparatus in the prior art and could be located on or proximate a terminal of the extendable/retractable arm. Therefore, the total load moved along the extendable/retractable arm and swung along a direction vertical to the extendable/retractable arm is much lighter, so that the system may further consume less power with lower cost and simpler mechanism. For example, when there is no second arm and driving apparatus in the prior art, the swing motion can be easily achieved by using an extendable/retractable arm that is flexible to swing in a direction vertical to the direction of the extendable/retractable arm. Similarly, by using an extendable/retractable arm that is flexible to rotate around its' axis, the invention can easily tilt the wafer around the axis.

In the prior art, the driving apparatus must be able to move along the arm. Hence, a mechanical interaction between them is necessary, and then the arm usually is rigid body to provide required mechanical support. In contrast, in the invention, owing to the extendable/retractable arm need not to support such a mechanical support, the extendable/retractable arm need not be a rigid body and then it can swing and/or rotate more easily, with simple mechanism and low cost.

Finally, each device discussed above are only retracted by its function, such as supporting, tilting, swinging, etc. Hence, it is clear that the invention is not limited by what kind of hardware, even software and firmware, is used to achieve the concept of the invention.

Although specific embodiments of the present invention have been described, it will be understood by those of skill in the art that there are other embodiments that are equivalent to the described embodiments. Accordingly, it is to be understood that the invention is not to be limited by the specific illustrated embodiments, but only by the scope of the appended claims.

What is claimed is:

1. A system for moving a wafer during scanning said wafer, comprising:
   an extendable/retractable arm, at least a length of said extendable/retractable arm parallel to a direction being adjustable;
   a holding apparatus, fixed on a specific portion of said extendable/retractable arm and capable of holding said wafer;
   a swing driving apparatus, capable of swinging said extending/retracting arm along another direction substantially perpendicular to both of a transmission path of an ion beam and an axis of said extendable/retractable arm, wherein an end of said extendable/retractable arm is pivoted via said swing driving apparatus, said extending/retracting arm being configured to be swung within a plane perpendicular to said transmission path of an ion beam, a swing direction not being a rotation direction, and the extendable/retractable arm being extendable within a plane of the swing; and
   a first driving apparatus, capable of extending and/or retracting said extendable/retractable arm such that said holding apparatus is moved with said specific portion.

2. The system as claimed in claim 1, wherein said end of said extendable/retractable arm is fixed on a portion of an ion implanter via said swing driving apparatus, and another end of said extendable/retractable arm is free.

3. The system as claimed in claim 1, said holding apparatus comprising:
   an arm, mechanically connected to said extendable/retractable arm, wherein an axis of said arm, which is mechanically connected to said extendable/retractable arm, is different from an axis of said extendable/retractable arm;
   a wafer holder, wherein said holding apparatus is capable of holding said wafer via said wafer holder; and
   a second driving apparatus, capable of moving said wafer holder back and forth along said axis of said arm mechanically connected to said extendable/retractable arm.

4. The system as claimed in claim 1, further comprising a tilting driving apparatus capable of tilting said extendable/retractable arm around an axis of said extendable/retractable arm, so as to tilt said wafer around said axis of said extendable/retractable arm.

5. The system as claimed in claim 1, said holding apparatus further comprising a tilting driving apparatus capable of tilting said wafer around a tilt axis being parallel to said axis of said extendable/retractable arm.

6. The system as claimed in claim 1, further comprising a tilting driving apparatus capable of tilting said extendable/retractable arm around a tilt axis not parallel to an axis of said extendable/retractable arm, so as to tilt said wafer around said tilt axis.

7. The system as claimed in claim 1, said holding apparatus further comprising a tilting driving apparatus capable of tilting said wafer around a tilt axis not parallel to an axis of said extendable/retractable arm.

8. The system as claimed in claim 1, further comprising a wafer position apparatus capable of putting said wafer on a horizontal loading position.

9. The system as claimed in claim 1, said holding apparatus further comprising a wafer position apparatus capable of putting said wafer on a horizontal loading position.

10. The system as claimed in claim 1, wherein said wafer is driven to move on a two dimensional plane substantially perpendicular to said transmission path of said ion beam by both of said swing driving apparatus and said first driving apparatus.

11. A system for moving a wafer back and forth during scanning said wafer, comprising:
- an extendable/retractable arm, at least a length of said extendable/retractable arm parallel to a direction being adjustable;
- a holding apparatus, fixed on a specific portion of said extendable/retractable arm and capable of holding said wafer; and
- a first driving apparatus, capable of extending and/or retracting said extendable/retractable arm such that said holding apparatus is moved with said specific portion, wherein said holding apparatus comprising:
  - an arm, mechanically connected to said extendable/retractable arm, wherein an axis of said arm, which is mechanically connected to said extendable/retractable arm, is perpendicular to an axis of said extendable/retractable arm;
  - a wafer holder, wherein said holding apparatus is capable of holding said wafer via said wafer holder; and
  - a second driving apparatus, capable of moving said wafer holder back and forth along said axis of said arm mechanically connected to said extendable/retractable arm.

12. The system as claimed in claim 11, wherein an end of said extendable/retractable arm is fixed on a portion of an ion implanter, and another end of said extendable/retractable arm is free.

13. The system as claimed in claim 11, further comprising a tilting driving apparatus capable of tilting said extendable/retractable arm around an axis of said extendable/retractable arm, so as to tilt said wafer around said axis of said extendable/retractable arm.

14. The system as claimed in claim 11, said holding apparatus further comprising a tilting driving apparatus capable of tilting said wafer around a tilt axis being parallel to said axis of said extendable/retractable arm.

15. The system as claimed in claim 11, further comprising a tilting driving apparatus capable of tilting said extendable/retractable arm around a tilt axis different from an axis of said extendable/retractable arm, so as to tilt said wafer around said tilt axis.

16. The system as claimed in claim 11, said holding apparatus further comprising a tilting driving apparatus capable of tilting said wafer around a tilt axis different from an axis of said extendable/retractable arm.

17. The system as claimed in claim 11, further comprising a wafer position apparatus capable of putting said wafer on a horizontal loading position.

18. The system as claimed in claim 11, said holding apparatus further comprising a wafer position apparatus capable of putting said wafer on a horizontal loading position.

19. The system as claimed in claim 11, wherein said wafer is driven to move on a two dimensional plane substantially perpendicular to said transmission path of said ion beam by both of and said first driving apparatus and said second driving apparatus.

* * * * *